(12) United States Patent
Engl

(10) Patent No.: US 8,947,101 B2
(45) Date of Patent: Feb. 3, 2015

(54) METHOD AND SYSTEM FOR MEASURING THE RESISTANCE OF A RESISTIVE STRUCTURE

(71) Applicant: Linear Technology Corporation, Milpitas, CA (US)

(72) Inventor: Bernhard Helmut Engl, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 213 days.

(21) Appl. No.: 13/734,581

(22) Filed: Jan. 4, 2013

(65) Prior Publication Data

US 2014/0191768 A1    Jul. 10, 2014

(51) Int. Cl.
*G01R 35/00* (2006.01)
*G01R 17/10* (2006.01)
*G01R 27/14* (2006.01)
G01R 1/20 (2006.01)
G01R 27/16 (2006.01)

(52) U.S. Cl.
CPC ............ *G01R 35/005* (2013.01); *G01R 17/105* (2013.01); *G01R 27/14* (2013.01); *G01R 1/203* (2013.01); *G01R 27/16* (2013.01)
USPC ........ 324/601; 324/202; 324/750.3; 327/540; 702/99

(58) Field of Classification Search
CPC ........ G01R 27/00; G01R 27/14; G01R 27/16; G01R 11/185
USPC .................................. 324/601, 202
See application file for complete search history.

(56) References Cited

U.S. PATENT DOCUMENTS

| 4,591,743 | A | 5/1986 | Kung |
| 5,121,064 | A * | 6/1992 | Eller .............................. 324/601 |
| 5,804,979 | A | 9/1998 | Lund et al. |
| 6,469,481 | B1 | 10/2002 | Tateishi |
| 6,618,684 | B1 * | 9/2003 | Beroset et al. .................. 702/99 |
| 6,909,275 | B2 * | 6/2005 | Hartzsch ....................... 324/713 |

(Continued)

FOREIGN PATENT DOCUMENTS

| DE | 10133525 A1 | 1/2003 |
| DE | 102011078334 A1 | 1/2003 |

(Continued)

OTHER PUBLICATIONS

U. Tietze, Ch. Schenk: "Halbleiter-Schaltungstechnik", 1993, Springer Verlag, Berlin XP002723495, ISBN: 3-540-56184-6 vol. 10, pp. 371-373.

(Continued)

*Primary Examiner* — Benjamin M Baldridge
(74) *Attorney, Agent, or Firm* — Cozen O'Connor

(57) ABSTRACT

Method and system for measuring the resistance of a resistive structure having at least three nodes. A first calibration signal is determined by measuring a voltage at an output of the resistance structure when no calibration current is injected into a third node between the first and second nodes of the structure. A calibration current is then injected into the third node and a second calibration signal is determined. The absolute value of the difference between the first calibration signal and the second calibration signal is determined, the absolute value being proportional to a product of the resistance of the resistive structure and the calibration current.

34 Claims, 7 Drawing Sheets

(56) References Cited

U.S. PATENT DOCUMENTS

| | | | |
|---|---|---|---|
| 7,042,242 B2 * | 5/2006 | Gearhardt | 324/750.3 |
| 7,536,577 B2 * | 5/2009 | Desai et al. | 713/340 |
| 7,733,163 B1 * | 6/2010 | Li | 327/540 |
| 8,013,668 B1 * | 9/2011 | Li | 327/540 |
| 8,106,669 B2 * | 1/2012 | Perras et al. | 324/706 |
| 8,604,777 B2 * | 12/2013 | Doogue et al. | 324/202 |
| 8,779,777 B2 * | 7/2014 | Irmer et al. | 324/601 |
| 2005/0264314 A1 * | 12/2005 | Gearhardt | 324/763 |
| 2009/0058524 A1 * | 3/2009 | Park et al. | 330/254 |
| 2013/0015843 A1 * | 1/2013 | Doogue et al. | 324/202 |
| 2014/0070820 A1 * | 3/2014 | Depernet et al. | 324/650 |
| 2014/0184199 A1 * | 7/2014 | Mueller et al. | 324/126 |

FOREIGN PATENT DOCUMENTS

| | | |
|---|---|---|
| EP | 1607753 A1 | 12/2005 |
| JP | S60192270 A | 9/1985 |
| JP | S62168067 A | 7/1987 |
| WO | WO-2006002446 A1 | 1/2006 |

OTHER PUBLICATIONS

Apr. 23, 2014 Extended European Search Report for European Application No. 14000004.3.

* cited by examiner

METHOD AND SYSTEM FOR MEASURING THE RESISTANCE OF A RESISTIVE STRUCTURE

TECHNICAL FIELD

This disclosure generally relates to the electrical arts, and more particularly to calibration of resistive structures.

DESCRIPTION OF RELATED ART

In recent years there has been an effort to improve methods and circuits to measure the resistance of resistive structures. Information about the resistance of a resistive structure is useful in many applications, including accurate measurement of current flow. Discrete current sense resistors suitable for accurate output current measurement typically have several requirements. For example, such current sense resistors may require sufficiently low manufacturing tolerances, long term stability, a low temperature coefficient, and/or other limitations. As the specifications become more demanding the component cost and complexity of the system may increase.

Some known approaches accommodate less demanding specifications (and thus lower costs) by providing some form of measurement and/or calibration of a current sense resistor during system operation.

Various methods for calibrating resistive structures during uninterrupted system operation exist. For example, in a first category of methods, the temperature of the resistive structure is measured and then compensated for the drift over temperature by using the measured temperature and known temperature coefficients of the resistive material. For example, U.S. Pat. No. 4,591,743 to Kung falls under this category.

A second category of methods, sometimes referred to as "DCR sensing" uses the parasitic resistance of an inductor of a switch-mode power converter. For example, U.S. Pat. No. 6,469,481 to Tateishi falls under the second category.

A third category of methods periodically injects predetermined test or calibration currents at an end of the resistive structure and determines its resistance via Ohm's law. For example, U.S. Pat. No. 7,536,577 to Desai et al., falls under this category.

A fourth category of methods infer the resistance of a current sense resistor at an output. For example, the resistance may be inferred from the switching parameters of a DC/DC converter and a measured input current to the DC/DC converter by a precision current sense resistor at an input. For example, this approach is described by G. Eirea and S. R. Sanders, *High Precision Load Current Sensing Using On-Line Calibration of Trace Resistance*, IEEE Transactions on Power Electronics, pages 907 to 914 (Vol. 23, Issue 2, March 2008), ("Eirea and Sanders.")

The foregoing prior art approaches have several disadvantages. For example, the first category of methods is unable to compensate for manufacturing tolerances by simply measuring temperature. Consequently, different initial resistance measurements and temperature coefficients of the resistance may result. Typically, a different initial resistance is accommodated by a one time calibration with a known test current at the end of the manufacturing process of the system or subsystem that includes the resistive structure.

Determining the temperature coefficient(s) of the resistive structure is much more costly. For example, a known test current is applied to the resistive structure at least at two different temperatures. The test equipment expenditure and the time for determining the temperature change for the stabilization, makes this individual determination of the temperature coefficient ("tempco") of each resistive structure impractical for most applications. Typically, it is necessary to compromise the temperature compensation by using batch-by-batch temperature coefficients that were obtained from several samples from a batch. Even worse, temperature coefficients may be used that were obtained by a single lab characterization of early prototypes. The foregoing approach regularly leads to poor performance of circuits over temperature.

Another disadvantage of the first category of methods is the inability to detect and compensate for long-term drift of the resistance. Depending on parameters (e.g., such as the material of the resistive structure, its mechanical construction, and environmental influences), resistance may change by several percent for every 1000 hours of operation. For typical current sense resistors, this long-term drift effect is more pronounced at higher temperatures. A typical remedy (aside from specifying more costly resistors that have better stability) is regular re-calibration, which typically increases the cost of ownership. Further, for this category, it implies periodic suspension of system operation.

The second category of methods relates to switch-mode power supplies. One disadvantage of this category is that the gain factor of the current measurement depends on the DCR of the inductor's coil winding, which (e.g., typically being made of copper), has a tempco in the order of 0.4% per Kelvin, which may be unacceptable for many applications. This category of methods typically requires matching a time constant of a discrete first resistor and capacitor pair (e.g., $R1 \times C1$) to an L/DCR time constant of the inductor. This inductor may be a moving target due to the high OCR temperature coefficient and the high manufacturing tolerances (e.g., in the 10 percent range) of the inductor. Further, the inductance L is also dependent on core magnetization, which varies over inductor current. Although attempts to provide temperature compensation of the DCR shift by providing means to measure inductor winding temperature (e.g., such as seen in U.S. Pat. No. 7,358,710 to Shiguo et al.,) have been made, they may not be accurate. For example, in such inductor DCR current sensing approaches, the difficulty in placing the temperature sensor (in this case a negative temperature coefficient (NTC)) in a suitable location such that the coil winding temperature is accurately tracked, is a source of a substantial loss of accuracy. Furthermore, none of the remedies of the second category helps against load life drift of the DCR resistance.

The third category of methods suffers from its inability to distinguish between the injected test and/or calibration currents and load current variations, which in typical systems occur in a random manner. For example, any change in load current alters the measured voltage differential over the current sense resistance to be calibrated. Accordingly, the accuracy of the calibration may be impaired if a change in load current occurs during the calibration. For example, the magnitude of the test current is typically designed to be much smaller than the maximum load current. In this regard, the outcome of the calibration may be wrong due to load current fluctuations that leak into the calibration channel.

The immediate remedy of switching OFF the load during the calibration may not be a practical solution for most cases since it interferes with the desired uninterrupted system operation. Even if switching OFF the load during calibration may be acceptable for some applications, such a calibration approach does not accurately track resistance changes while the system is in normal running condition. This is true even if a method to measure temperature of the resistive structure is provided. For example, there is a general difficulty in accurately measuring temperatures of distributed resistive structures (such as inductor windings and PCB traces) in a system environment (in contrast to a laboratory setup).

The fourth category of methods uses a precision current sense resistor on the input side of a switch-mode power supply. It will be understood that reliance on a precision current sense resistor instead of a regular (or no resistor) introduces additional cost. Accordingly, the fourth category merely avoids the voltage drop losses incurred by adding such a sense resistor on the low voltage output side of the switch-mode power supply. The current sense resistor itself is not able to be eliminated. Furthermore, the precision of the fourth category depends on the mode of operation of the switch-mode power supply, which may vary with load current. For example, the circuit discussed in *High Precision Load Current Sensing Using On-Line Calibration of Trace Resistance* does not achieve proper calibration at light loads and loses calibration capability once the converter enters discontinuous conduction mode.

In view of the foregoing, it would be desirable to provide an improved method and circuit to measure the resistance of a resistive structure while the system operates uninterrupted. It would also be desirable to measure the resistance of the resistive structure without having to measure component temperature. It would also be desirable to track and compensate for adverse effects (e.g., such as many manufacturing tolerances, temperature drift of the resistance, load life drift of resistance due to aging (poor long term stability, etc.)) that may alter the resistance of the resistive structure.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The various examples discussed below relate to methods and circuits to measure the resistance of a resistive structure during uninterrupted system operation. Suitable resistive structures, among others, are discrete resistors or parasitic resistances associated with the metal layers of integrated circuits, printed circuit board foil, connection wiring, sheet metal, cable runs, or any other resistances, as long as they obey Ohm's law and have sufficiently low parasitic capacitances and inductances.

In one embodiment, the calibration process discussed herein is fully transparent to the system operation and typically does not interfere with it. The influence of a load current interference on the calibration result can be designed to be very low. In one aspect, calibration at low (or zero) load current may be performed without adversely affecting the calibration accuracy. In one aspect, the energy consumption of the calibration process discussed herein may be designed to be very low.

In one embodiment, the circuit and method described herein are able to perform calibration of a range of resistive materials in different shapes, forms, and sizes. The resistance accommodated can span many orders of magnitude. For example, resistance ranges of $100\mu\Omega$ to $1\Omega$ or more are supported. In one aspect, the resistive structure does not need to be a lumped element, such as a series connection of two resistors having three electrical nodes; rather, the concepts embodied herein also apply when the resistive structure is any distributed resistance (e.g., a mesh of resistors, such as from finite element analysis). In one embodiment, parasitic resistive structures in the form of printed circuit board traces or printed circuit board planes may be used as current sense resistors. In implementations where the inherent parasitic resistances (e.g., such as printed circuit board traces or wire runs) are used as precision current sense resistors after appropriate calibration, the additional voltage drop associated with adding a true current sense resistor can be avoided, thereby saving energy.

Figure 1:
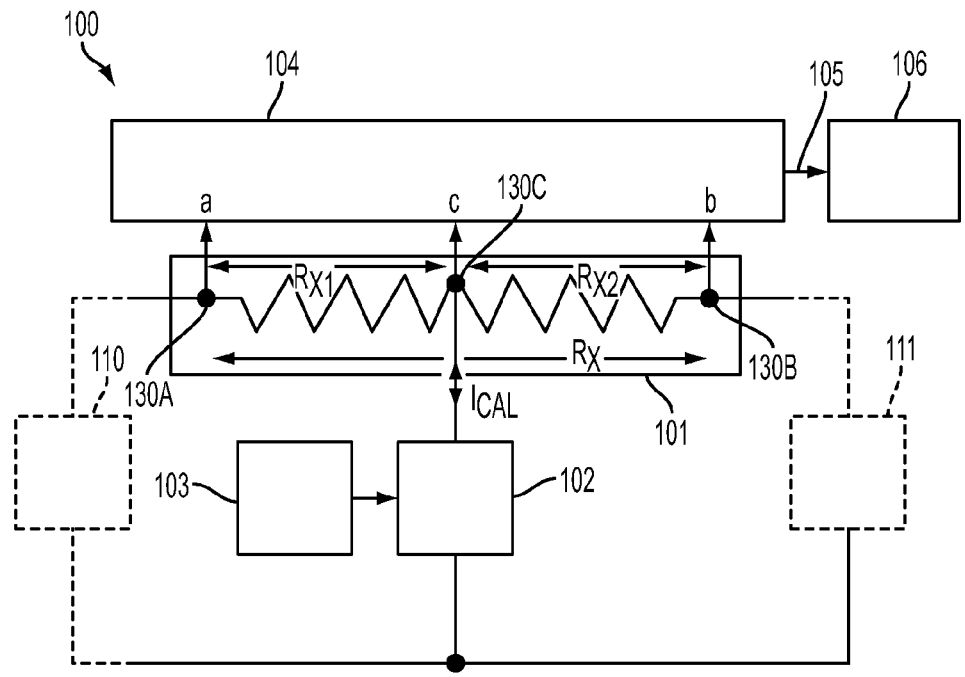
FIG. 1 illustrates a system having a resistive structure, consistent with an embodiment of the present invention.

Reference now is made in detail to the examples illustrated in the accompanying drawings and discussed below. FIG. 1 illustrates a system 100 having a resistive structure 101, consistent with an embodiment of the present invention. In one embodiment, the resistive structure 101 has a total resistance Rx between a first node 130A and a second node 130B. At least one additional node (e.g., third node 130C) is provided that electrically and/or mechanically is located between the first node 130A and the second node 130B. For example, a first partial resistance Rx1 appears between the first node 130A and the third node 130C and a second partial resistance Rx2 appears between the third node 130C and the second node 130B. A total resistance Rx is provided by the sum of partial resistances Rx1 and Rx2. The magnitude of the resistances Rx, Rx1, and Rx2 may be unknown.

The resistive structure 101 may be part of a circuit. In one embodiment, the first node 130A is connected to a power supply 110, and the second node 130B is connected to a load 111. For example, the resistive structure 101 acts as a current sense ("shunt") resistor, that facilitates the measurement of a current flowing through resistive structure 101 by measuring the voltage across the first node 130A and the second node 130B and calculating the load current by Ohm's law, as provided by Equation 1 below.

$$I_{load} = V(AB)/Rx \qquad \text{(Eq. 1)}$$

when the magnitude of Rx is known.

In one embodiment, a calibration current circuit block 102 provides current (e.g., in the form of pulses) to resistive structure 101 (Rx). Accordingly, calibration current generating circuit block 102 is used to measure the resistance of resistive structure 101 (Rx). In one example, the calibration current generating circuit 102 is coupled to at least the third node 130C in at least one state of operation. "Coupled" in this context means that the calibration current need not be injected exactly into the third node; rather, any appropriate location in the vicinity of the third node may also be used to inject the calibration current. However, the closer to the third node the better the accuracy. A distinctive advantage provided by injecting a calibration current ($I_{CAL}$) to the third node 130C of the resistive structure 101 is that reactive components (e.g., such as power supply decoupling capacitors) tied to nodes 130A and/or 130B (e.g., 110 and 111) do not impair or disturb the calibration current pulses ($I_{CAL}$).

System 100 may include a control circuit 103 coupled to the calibration current generating circuit block 102. Control circuit 103 has at least two states of operation to change a calibration current ($I_{CAL}$) or to guide the calibration current $I_{CAL}$ to either one of at least two of the three nodes of the resistive structure (i.e., 130A, 130B, and 130C) alternately. For example, instead of changing the calibration current ($I_{CAL}$) between two states, (which may be "calibration current ON" and "calibration current OFF," two different magnitudes of the calibration current, or two different signs of the calibration current), the calibration current may be "ON" during the calibration but alternated between node 130C and node 130A, or be alternated between node 130C and node 130B. For example, the alternation may be accomplished by electronic switching means, such as a pair of MOSFETs (not shown in FIG. 1) tied between the output of the calibration current source 102 and node 130O and nodes 130A/B of the resistive structure 101, respectively. It will be understood that adding such MOSFETs (or any other circuit elements) to the calibration current path still couples the calibration current generating circuit to the third node 130C of the resistive structure 101.

System 100 may include a signal conditioning circuit block 104 that is coupled to the first node 130A, the second node 130B, and the third node 130C to form a conditioned signal at its output 105. The signal at the output 105 provides the difference (or an amplified difference) between the electrical potential at the third node (130C) of the resistive structure 101 and the weighted average of the electrical potential at the first and second nodes (130A, 130B) of the resistive structure 101.

In one embodiment, system 100 includes a signal processing circuit block 106 that is coupled to the output 105 of the conditioning circuit block 104. The signal processing circuit block 106 uses the signal at the output 105 (provided by the conditioning circuit block 104) to determine the resistance Rx of the resistive structure 101. The signal processing block 106 is discussed in more detail later.

Figure 2:
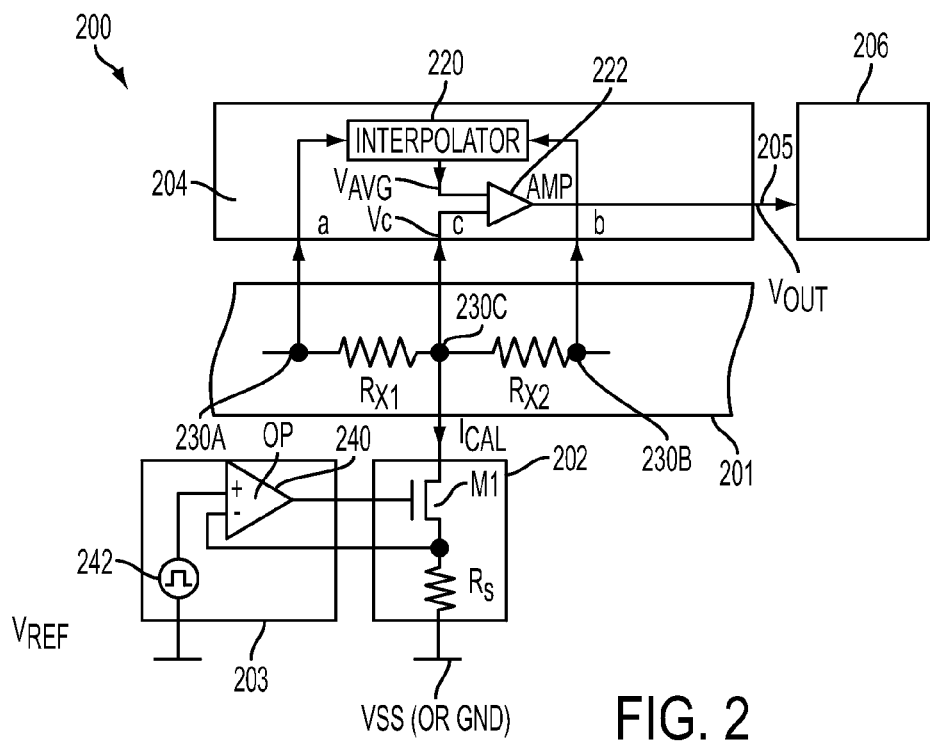
FIG. 2 illustrates a more detailed view of a system having a resistive structure, consistent with an embodiment of the present invention.

FIG. 2 is a more detailed representation of a system 200 having a resistive structure 201, consistent with an embodiment of the present invention. For example, the resistive structure 201 may be a piece of resistive material having at least a first connection node 230A, a second connection node 230B, and a third connection node 230C. Connection node 230C is between node 230A and node 230B. In one embodiment, connection node 230C is halfway between connection nodes 230A and 230B, in the center area, such that partial resistances Rx1=Rac and Rx2=Rcb are of substantially identical resistive value, as provided in Equation 2 below.

$$Rx1 = Rx2 = Rac = Rcb \qquad \text{(Eq. 2)}$$

Accordingly, the desired response signal at node 230C is maximized, which decreases in amplitude the further node 230C is moved away from the center of the resistive structure 201. In one embodiment, node 230C (from which the signal is taken) is positioned away from the center (e.g., at a distance where the resistance is ⅓ of the total resistance). It should be noted that when node 230C is too close to one of the nodes 230A or 230B, then the response signal may degrade.

The calibration current generating circuit block 202 may comprise a regulation transistor M1. In one embodiment, the regulation transistor M1 is a double-diffused metal-oxide-semiconductor (DMOS) transistor. The drain of the regulation transistor M1 may be tied to the third connection node 230C. In one embodiment, the drain of regulation transistor M1 is coupled to the third connection node 230C by tying the drain to one or more locations in the vicinity of the third node of the resistive structure. In one embodiment, the calibration current generating circuit block 202 includes a reference resistor Rs having a first node coupled to the source of the regulation transistor M1 and a second node coupled to Vss (or ground). Reference resistor Rs generally does not see the load current $I_{LOAD}$; rather, it sees the calibration current $I_{CAL}$, which may be orders of magnitude smaller than the maximum load current. Further, the calibration current $I_{CAL}$ may comprise short pulses and have a small duty cycle. Accordingly, resistor Rs may be much smaller in size and of lower power rating (and hence, of lower cost) than a precision shunt resistor that is able to sustain the full load current. If an optional secondary calibration step (described later) is added, reference resistor Rs may also have a large tolerance, large temperature coefficient, and poor stability (and thus be of even lower cost), without substantially impairing the precision of the resistance calibration system 200 discussed herein.

Control circuit block 203 may comprise an op-amp 240 and a programmable reference voltage source $V_{REF}$ 242 coupled to the (e.g., DMOS) regulation transistor M1 and reference resistor Rs to form a current servo loop. For example, control circuit block 203 provides a calibration current as provided in Equation 3 below:

$$I_{CAL} = V_{REF}/Rs \qquad \text{(Eq. 3)}$$

In one embodiment, at least two states of the control means are implemented by providing two states of the programmable reference voltage source $V_{REF}$ 242. For example, in a first state, zero voltage is provided and in a second state, a positive voltage is provided. The positive voltage may be approximately 1 V. In some embodiments, the reference voltage $V_{REF}$ 242 need not be too precise and it also may have a large temperature drift without substantially impairing the precision of the resistance calibration system 200 discussed herein, as long as the reference voltage is substantially stable for the brief periods of time during which the calibration current is switched "ON." For example, the reference voltage $V_{REF}$ 242 defines the gross magnitude of the calibration current pulse during a brief interval of time. If the reference voltage is off by some 10% to 30% from the designed typical value, the calibration 200 discussed herein still may work precisely as long as the circuitry does not exceed its operational margins and if the reference voltage is also used within the signal processing, which is described later.

In one embodiment, the signal conditioning circuit block 204 comprises an interpolator (IP) 220 that forms a weighted average voltage between the voltages at node 230A (Va) and at node 230B (Vb) as provided by Equation 4a below.

$$V_{avg} \alpha (1-a) V_a + (1+a) V_b \qquad \text{(Eq. 4a)}$$

Accordingly, Equation 4a describes a proportional relationship. For example, when passive interpolators (e.g., based on resistors and/or capacitors) are used the proportionality factor typically is 0.5 and Equation 4a takes the form of Equation 4b below:

$$V_{avg} = 0.5 * [(1-a) * V_a + (1+a) * V_b] \qquad \text{(Eq. 4b)}$$

In another example, where active interpolators (e.g., based on operational amplifiers) are used, there may be an interpolator gain GI. In this regard, the proportionality factor may be other than 0.5, as provided by Equation 4c below:

$$V_{avg} = (GI*0.5)*[(1-a)*Va+(1+a)*Vb] \qquad \text{(Eq. 4c)}$$

In Equations 4a to 4c above, "a" is an interpolation parameter that may be constant or variable. It corresponds to the location of the third node 230C in relation to the first and second nodes 230A and 230B. An exemplary choice for the setting interpolation parameter "a" is discussed below. In many practical implementations, numerical values for interpolation parameter "a" may, for example, span a range of −0.3 to +0.3, depending on the expected mechanical, thermal and electrical tolerances of the resistive structure 201. In some embodiments, numerical values for the interpolation parameter "a" may exceed this range. However, exceeding this range may reduce attainable accuracy of the calibration. For example, accuracy of the calibration for a given calibration current level is best when the signal Vavg has the largest amplitude, which occurs when interpolation parameter "a" is zero or close to zero. High accuracy can be accomplished by reducing the mechanical, thermal and electrical tolerances of the resistive structure to a reasonable level and by bringing the third node 230C as close to the electrical center equipotential line between the first and second nodes as reasonably possible (e.g., by proper exploitation of the given capabilities of the manufacturing process used to make the resistive structure). For basic geometries, such as a resistive structure having a rectangular shape, the preferred location to place the third node 230C (e.g., such that the interpolation parameter "a" is close to zero) is at the centroid of the shape between nodes 230A and 230B (e.g., at the intersection of the diagonals of the rectangular shape). For more complicated shapes, a finite element analysis may be conducted to find the optimum place for the third node.

Signal conditioning circuit block 204 also may include a difference amplifier (AMP) 222 that is configured to amplify the difference between a voltage Vc at the third node 230C and the weighted average voltage Vavg provided by interpolator 220 with a gain factor of GA, as provided by Equation 5a below.

$$Vout = GA*(Vavg - Vc) \qquad \text{(Eq. 5a)}$$

If an active interpolator having an interpolator gain GI is used, then the input of the difference amplifier 222 coupled to the third node 230C of the resistive structure 201 has a gain as provided by Equation 5b below.

$$Vout = GA*(Vavg - GI*Vc) \qquad \text{(Eq. 5b)}$$

In one embodiment, this difference amplifier gain function of Equation 5a and the weighted average function of the interpolator 222 may be combined by configuring an operational amplifier according to known procedures to achieve a transfer function as provided by Equation 6 below.

$$Vout = GA*\{0.5*[(1-a)*Va+(1+a)*Vb] - Vc\} \qquad \text{(Eq. 6)}$$

For example, the calculation above involves a first input network coupling Va and Vb to a first input of an operational amplifier and a second input network coupling Vc to a second input of the operational amplifier. Further, a feedback network couples the output of the operational amplifier to the inverting input of the operational amplifier. The first and second input network and the feedback network may be resistive or capacitive.

In one embodiment, the interpolator 220 comprises a string of resistors having a center tap (or multiple selectable taps arranged around the center). The tap location (e.g., corresponding to interpolation parameter "a") is chosen to correspond to the location of the third node 230C in relation to the first and second nodes 230A and 230B. An exemplary procedure for the choosing interpolation parameter "a" is discussed below.

In one embodiment, the interpolator 222 may be combined with the amplifier 240 (e.g., configured as a switched capacitor circuit), where the interpolation parameter "a" is implemented as a ratio of input capacitors of the switched capacitor circuit, or is inherent in the switching sequence. An advantage of such a capacitive interpolator is that it does not draw DC currents from the resistive structure, so it may offer the same or better calibration accuracy as a high ohmic resistive interpolator does.

In various embodiments where a distributed resistive structure 201 is used (e.g., such as a PCB foil run), more than one node (e.g., C, C', C" of FIG. 8) near or at the center of the resistive structure 201 may be used to inject calibration currents. Further, more than one of these nodes may be used to provide a voltage Vc to an input node of the difference amplifier 222. In one embodiment, if more than one such node contributes to the voltage level at node Vc, the difference amplifier 222 may include multiple inputs to accommodate the multiple input voltages. For example, each voltage input to the amplifier 222 may have equal or individual gain factors. In one embodiment, finite element analysis of the distributed resistive structure 201 is used to determine optimum gain factors for each input of a multiple input difference amplifier. In the finite element model, the gain factors are easily determined from the relative magnitude of the electric potentials at the nodes providing the multiple input voltages when a known calibration current is injected at one or multiple other nodes in their vicinity.

The signal processing circuit block 206 may comprise a switched capacitor integrator and comparator (e.g., an analog to digital converter (ADC) based on delta-sigma modulator techniques). For example, the switched capacitor integrator and comparator are configured as a modulator of a delta sigma analog-to-digital converter. The modulator uses a reference voltage that tracks the reference voltage 242 that is used to regulate the calibration current $I_{CAL}$. In one embodiment, the signal processing circuit block 206 adds or subtracts Vout and/or reference voltages from a stored integration result and checks for the sign of the integration result. A digital decimation filter may be added in hardware or implemented in software. In one embodiment, the reference voltage for the ADC is the same as the reference voltage 242 for the control circuit block 203. Put differently, the reference voltage for the ADC and reference voltage 242 both are derived from a common voltage source. In this case, the ADC result automatically corrects for any imprecision or temperature drift of the reference voltage source, as mentioned above.

With the foregoing overview of the system 200, it may be helpful now to consider a high-level discussion of an exemplary operation of the system 200. In a first phase of operation, reference voltage source $V_{REF}$ 242 is set to zero (i.e., calibration current $I_{cal}$, is OFF) and Vout at node 205 is sampled (e.g., by a delta sigma ADC within the signal processing block 206). This may be the first sample of a correlated double sampling (CDS) signal processing method.

In a second phase of operation, reference voltage source $V_{REF}$ 242 is set to a positive voltage (e.g., to 1.23V, which may be provided by a band-gap reference, but also can be from a reference that is much less precise than a band-gap reference). The calibration current drawn from the third node 230C is provided by Equation 7 below.

$$I_{CAL}=V\text{REF}/Rs \quad \text{(Eq. 7)}$$

After a brief delay (i.e., when the calibration current is sufficiently stable), Vout at node 205 is sampled again. In one embodiment, this represents the second sample of the CDS signal processing method. It should be noted that other sampling, measurement, or digitizing approaches known in the art of signal processing may be used, as long as they achieve the capture of the Vout difference between the two phases of operation. In one embodiment, the first phase and second phase operations are periodic.

In one embodiment, an idle phase is included. For example, in the optional idle phase, reference voltage source $V_{REF}$ 242 is again set to zero volts. To save power during the optional idle phase, all the functional blocks discussed above (such as reference voltage source $V_{REF}$ 242, AMP 222, Interpolator 220, and the ADC) may be set to a power down state. The optional idle phase also helps to cool down the electronic components that generated the calibration current pulse. As noted above, the idle phase is optional since the same cool down effect can be achieved in one embodiment by making the first phase of operation significantly longer than the second phase of operation.

For example, the absolute value of the difference between the signal samples taken in the first phase and the second phase is proportional to the product of the total resistance Rx*$I_{CAL}$, even in the presence of offset voltages in the amplifiers or in the ADC. The proportionality factor itself may depend on the total system 200 gain. An advantage of the exemplary signal processing technique discussed herein is that parasitic thermocouple voltages at the three nodes 230A, 230B, and 230C do not have any influence on the measurement of Rx.

In one embodiment, if the reference voltage source $V_{REF}$ 242 is also used in the ADC, it is not included in the system gain equation for Rx/Rs. Accordingly, the reference voltage source $V_{REF}$ 242 need not be very precise.

Further, in one embodiment, if the interpolation parameter "a" discussed above is chosen such that the weights used in forming the weighted average of the voltages are proportional to the magnitude of the partial resistances Rx1 and Rx2, then the load current flowing though the resistive structure 201 (Rx) also has no effect on the measurement of the resistive structure 201 (Rx).

If the resistive structure is such that the interpolation parameter "a" does not need tuning (e.g., when there are no significant thermal gradients across the resistive structure or if its temperature coefficient of resistance is small), a trim circuit may be used to set the interpolation parameter "a" to an optimum value. For example, this optimum value may be determined once during the production of the system. For example, if the resistive structure is part of an integrated circuit, laser blown fuse links or some other known form of trimming circuitry may be used to choose one of several taps on a resistive interpolator to set the interpolation parameter "a" to an optimum value.

In one embodiment, automatic tuning of the interpolation parameter "a" of the interpolation (performed by interpolator 220) can be accomplished by varying interpolation parameter "a" until Vout is minimal in the first phase of operation, (e.g., when calibration current is zero).

Tuning circuitry for automatic tuning of the interpolation parameter "a" may take several forms. In a preferred embodiment, tuning is based on detecting a residual signal Vout (205) that is caused by a change in the magnitude of currents that enter the resistive structure 201 through the first node and exit at the second node (or vice versa), during operation of the system.

For example, the tuning circuitry or tuning method discussed herein may use the correlation between load current (e.g., observed as voltage Vab between nodes 230A and 230B) and Vout at node 205. The ideal tuning point is where the correlation is minimized. In one example, to achieve minimization of the correlation, the correlation circuit simply provides the sign of the correlation, and the tuning process changes the chosen tap on a resistive interpolator up or down, depending on the sign. After a brief period of operation, the tuning process jumps between the two most optimum taps. Interpolation parameter "a," which enters the gain equation for the calibration process as a factor $(1-a^2)$, follows from the chosen tap location according to Equation 5 above. This factor (e.g., close to 1.00 for small deviations from the ideal center tap case), may be ignored for systems calling for modest accuracy. However, in more accurate systems this factor may also be used by the signal processing block to correct for a change in calibration gain. Hence, the system can automatically track and correct for any deviations from the ideal center tap case.

Figure 9:
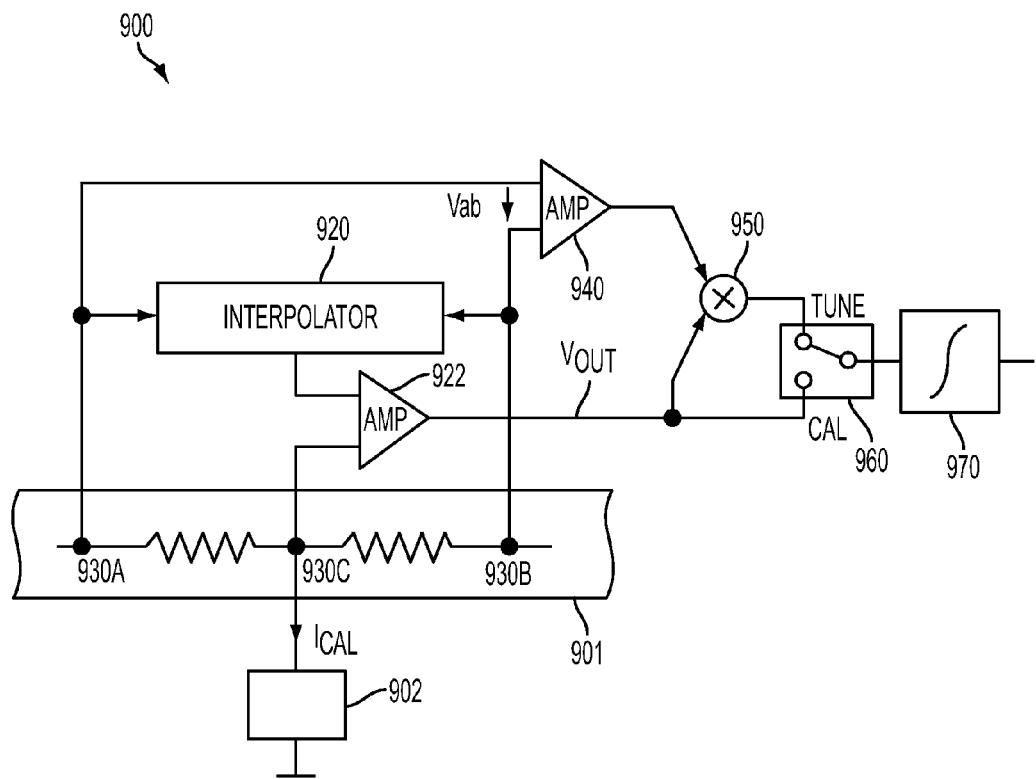
FIG. 9 illustrates a system having a tunable interpolator and a correlator circuit to guide the interpolator tuning process, consistent with an embodiment of the present invention.

FIG. 9 illustrates a correlation circuit 900, compatible with an embodiment of the present invention. In the example of FIG. 9, correlation circuit 900 comprises an analog four quadrant multiplier 950 coupled to an integrator 970. The differential voltage Vab across the input nodes of the amplifier 940 provides the first input signal and Vout provides the second input signal of the four quadrant multiplier 950. In one embodiment, differential voltage Vab is amplified by an amplifier 940 before providing it to the four quadrant multiplier 950. In one embodiment, a delta sigma modulator of an ADC is used in lieu of an analog integrator 970. To allow reuse of an integrator or ADC used in the calibration circuitry for the tuning process, a switch 960 may be used. For example, the switch 960 couples the integrator 970 to Vout in a "CAL" state while coupling the integrator 970 to the multiplier (950) in a "TUNE" state to provide a correlator. If the load current is unidirectional, a two quadrant multiplier may be used instead. The correlation also may be performed in the digital domain by correlating the PWM bit streams of two delta sigma modulators, one being provided the signal Vab, and the other one being provided by Vout at node 205. The signals Vab and/or Vout may be amplified before being sent to the multiplier.

In various embodiments, the correlation operation (i.e., the interpolation parameter "a" tuning process) may use the natural load current ripple caused by the inductor current ripple inherent to switch-mode power supplies, load current ripple that may be caused by changing the data processing (CPU) load, and the like. For example, current ripple of sufficient amplitude may not be available to perform the interpolator 220 tuning. In this regard, system software may provoke sufficient load current ripple by, for example, performing many computations from time to time, and less computations at other times, to modulate the load current. The system software also may intelligently control the tuning process to occur during such phases of operation where sufficient load current is present due to a varying computational load.

Load current ripple suitable for the correlation operation may also be generated by modulating the voltage feedback network of a switching or linear regulator power supply. For example, such load current ripple can be achieved by coupling a rectangular digital modulation signal to the feedback pin of a switching power supply via a resistor. For example, the resistance of the resistor is chosen such that a digital signal swing changes the output voltage of the switching power supply within the limits specified by the load. For example, for a load that can tolerate a 10% supply voltage variation, the modulation of the output voltage of the switching power supply can be set to 5%. In one embodiment, the period of the rectangular digital modulation signal is preferably is 10 to 100 times longer than the switching frequency. However, any other timing also may be used as long as the voltage control loop transient response to the modulation is detectable. For example, in the correlation operation, the voltage Vout of node 205 may be multiplied with a signal derived from the digital modulation signal. In one embodiment, a delayed version of the modulation signal is used, where the delay is chosen such that optimum sensitivity of the correlation process is achieved. Instead of using the modulation signal, the voltage Vout of node 205 may be also be multiplied by the voltage difference between the voltage at the first node 230A and the second node 230B (Vab) or an amplified version thereof in the correlation operation.

Figure 10:
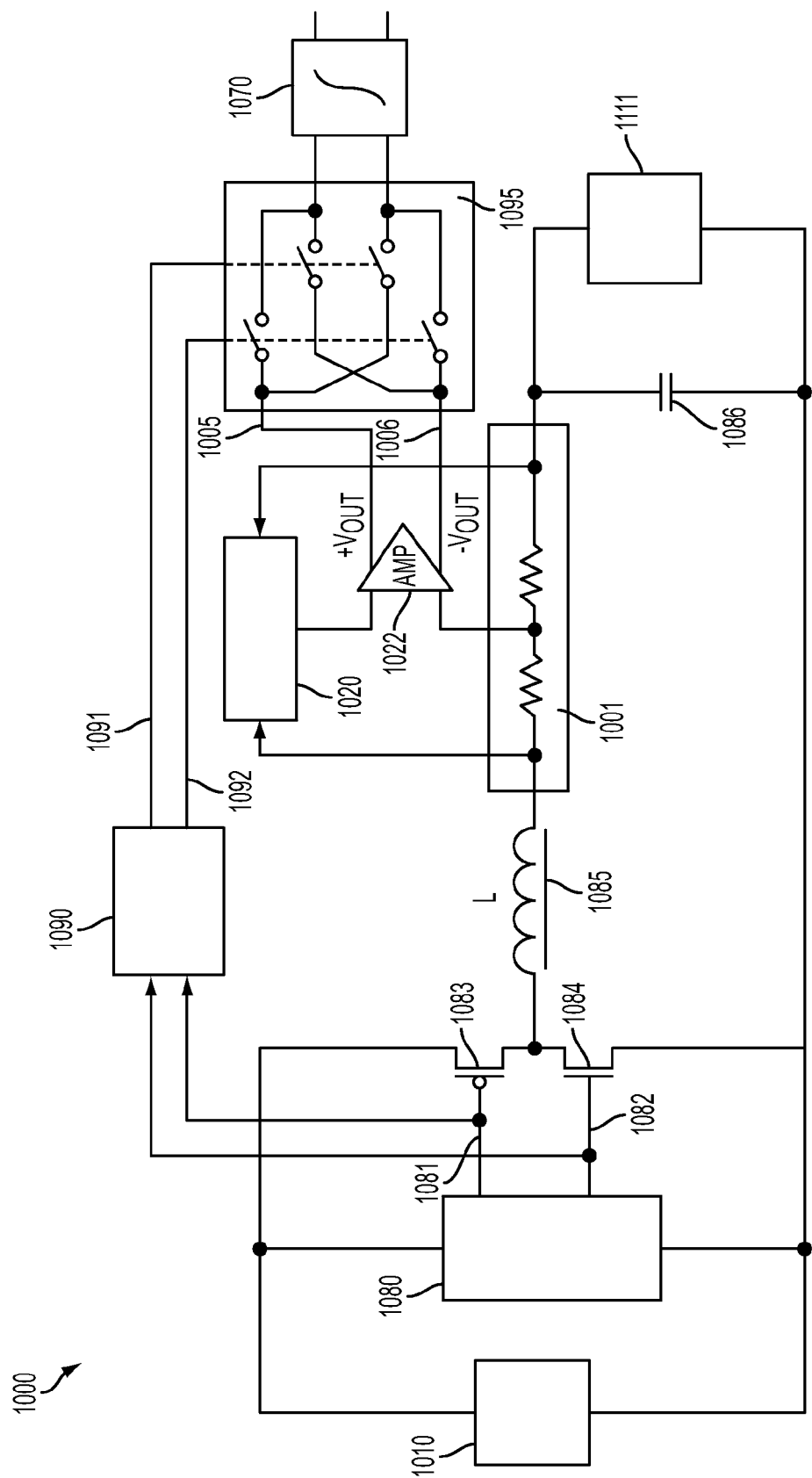
FIG. 10 illustrates a system having a tunable interpolator and a correlator circuit based on polarity reversing switches driven by switching phases of a switch-mode power supply, consistent with an embodiment of the present invention.

In one embodiment, the analog multiplier 950 is not used. Instead, the correlation operation uses the gate drive (switch pin) signal of a switching power supply. Reference now is made to FIG. 10, which illustrates a system having a tunable interpolator and a correlator circuit that is based on polarity reversing switches which are driven by switching phases of a switch-mode power supply, consistent with an embodiment of the present invention. The gate drive output(s) 1081, 1082 of a switching power supply controller 1080 may be amplified, shaped to a digital control signal, extended, or reduced in time duration, by a switch gate conditioning circuit 1090. The resulting digital control signals 1091 and 1092 may be used to set the polarity of the switch arrangement 1095. For example, the switch arrangement couples the voltage Vout 1005 or its polarity inverse 1006 from a difference amplifier 1022 to an integrator 1070 or analog to digital converter (ADC) (e.g., a delta sigma ADC). As shown in FIG. 10, the difference amplifier 1022 (e.g., corresponding to difference amplifier 222 of FIG. 2) may have a differential output, thereby allowing changing the polarity of the signals at nodes 1005 and 1006 before they are sent to the integrator 1070. Alternatively, in case of single ended difference amplifier, a polarity changing switch arrangement under control of the digital control signals 1091 and 1092 is used in the signal path before the difference amplifier 1022. However, additional gating for the desired timing window should then be added to its output. For example, the tunable interpolator 1020 corresponds to 220 in FIG. 2, and the resistive structure 1001 corresponds to 201 in FIG. 2. In one embodiment, the switching power supply 1000 includes a PFET 1083, an NFET 1084, an inductor 1085, and a capacitor 1086. The load 1111 is coupled to the output of the resistive structure 1001.

Figure 3:
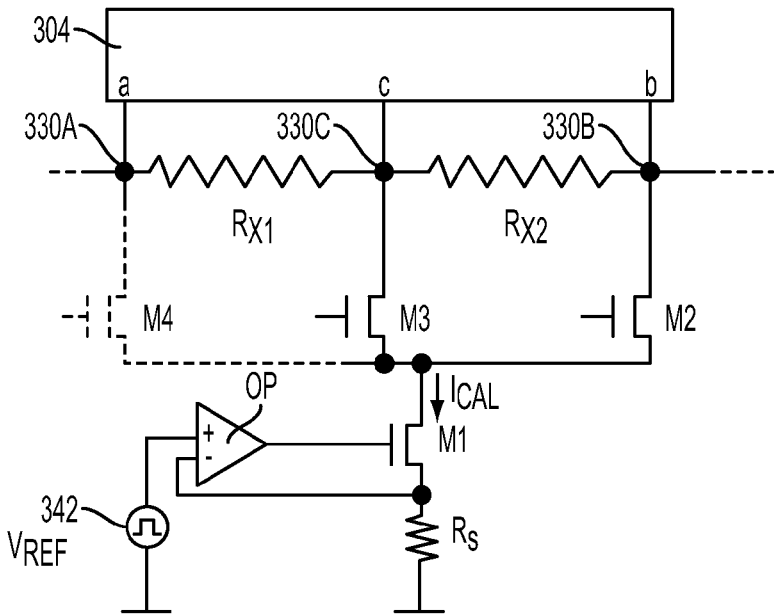
FIG. 3 illustrates a system having a resistive structure wherein a calibration current source is reused as a tuning current source to provide a load current ripple, consistent with an embodiment of the present invention.

In one embodiment, where a switching power supply is not present or an existing regulator cannot be used for the correlation processes as described above, the sufficient load current ripple is provided by a tuning current source coupled to at least one of the nodes 230A and 230B. For example, the tuning current source is then pulsed to create the desired ripple. Alternatively, as shown in FIG. 3, a calibration current source may be reused as a tuning current source for a load current ripple by providing additional paths to couple the ripple current to node 330A or 330B (or both nodes 330A or 330B alternately), in addition to the basic coupling to node 330C. For example some DMOS transistors (e.g., M2, M3, M4) may be added in the output branch of the calibration current generating circuit (e.g., 202 in FIG. 2). Transistor M3 is switched ON and M2/M4 are switched OFF to inject a calibration current pulse into the third node 330C. To generate a tuning current pulse, M3 is switched OFF and either M2 or M4 are switched ON. In one embodiment, transistor M4 is omitted if ping-pong operation between nodes 330A and 330B (e.g., where transistor M4 and M2 are alternatingly turned ON) is not desired. In one example, generating such tuning current pulses depends on the particular load and power supply circuitry (not shown) that is coupled to nodes 330A and 330B.

Figure 4:
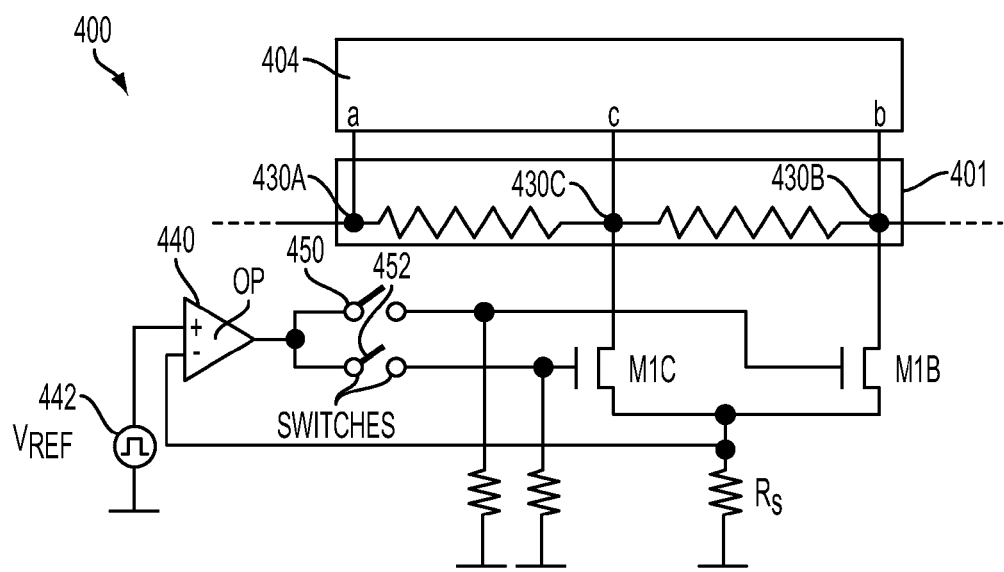
FIG. 4 illustrates a system that is capable of steering current in a resistive structure, consistent with an embodiment of the present invention.

FIG. 4 illustrates a system 400 that is capable of steering current in a resistive structure, consistent with an embodiment of the present invention. FIG. 4 illustrates a simplified configuration to more easily describe certain aspects of the invention. In one embodiment, several DMOS transistors (e.g., M1B and M1C) steer the calibration current pulses $I_{CAL}$ alternately to nodes 430B and 430C. The switching is provided by electronically controlled switches 450 and 452. Thus, the current pulses regulated by the operational amplifier 440 can be directed to either node 430C or node 430B, depending on which switch is closed. In one example, these pulses directed to node 430B of the resistive structure 401 may be used in lieu of natural load current ripple to tune the interpolation that is provided by the interpolator (within signal conditioning block 404). Alternatively, the drain of regulation transistor M1B may be tied to node 430A. In one embodiment, the drain of regulation transistor M1B is tied to the node 430A or 430B that has the smaller capacitance. Attaching the drain of regulation transistor M1B to the node with less capacitance forces the larger part of current pulse to flow though the resistive structure, thereby increasing the signal amplitude.

Figure 5:
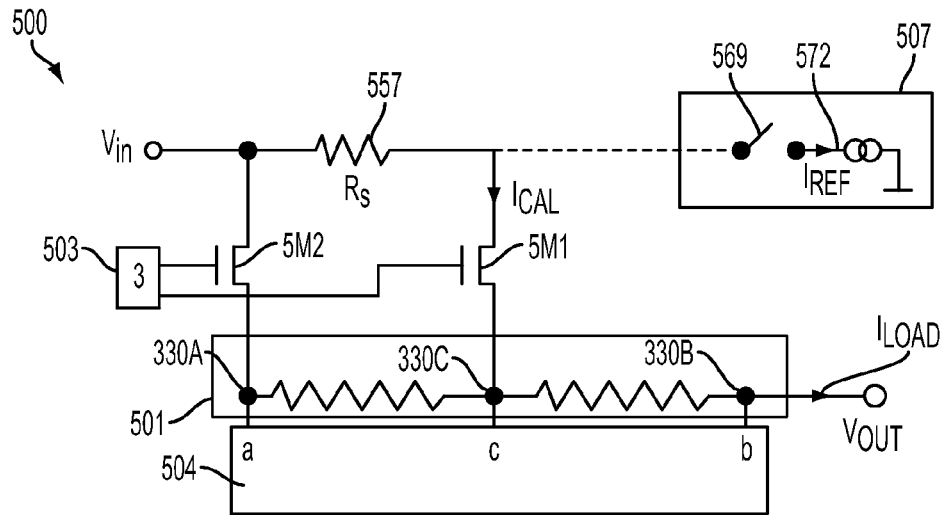
FIG. 5 illustrates a system that steers current in a resistive structure by splitting a switch, consistent with an embodiment of the present invention.

In various embodiments, the calibration current source may also be implemented by splitting a switch or pass transistor of a switch-mode or linear power supply. In this regard, FIG. 5 illustrates a system 500 that steers current in a resistive structure by splitting a switch, consistent with an embodiment of the present invention. For example, part of the load current $I_{LOAD}$ is periodically diverted from a first node (e.g., 530A) of the resistive structure 501 into a third node (e.g., 530C). This may be particularly beneficial if the resistive structure 501 and the switch or pass transistors (e.g., 5M2 and 5M1) are integrated on a switch-mode or linear-mode power supply chip. In one embodiment, the top metal layers of a semiconductor chip or bond wires may be used as the resistive structure 501.

It may be helpful now to consider a high-level description of an exemplary operation of the system 500. In one embodiment, in the first phase of operation, transistor 5M1 is OFF while transistor 5M2 carries all of the load current $I_{LOAD}$. In the second phase of operation, 5M1 is turned ON thereby carrying part of the load current $I_{LOAD}$. For example, at this stage, a part of $I_{LOAD}$ serves as the calibration current $I_{CAL}$ for the resistive structure 501. In one embodiment, the voltage drop across resistor 557 (Rs) is used to determine the calibration current $I_{CAL}$ or to regulate it to a desired value by including transistor 5M1 in the feedback loop. Since calibration current $I_{CAL}$ may be orders of magnitude less than the maximum load current $I_{LOAD}$, both transistors 5M1 and resistor 557 may be configured to handle a much smaller current than transistor 5M2 and resistive structure 501. Accordingly, in this embodiment, the calibration current pulses do not contribute to the power consumption.

The foregoing embodiments can be augmented with an additional (e.g., secondary) calibration step, where the resistor 557 (Rs) of the calibration current branch $I_{CAL}$ is calibrated against an additional reference resistor or a reference current, as represented the secondary calibration current source 507 of FIG. 5. In one embodiment, secondary calibration current source 507 comprises a switchable (e.g., 569) reference current source 572. When switch 569 is ON, the reference current source 572 is coupled to resistor 557 (Rs) of the calibration current circuit block. For example, switch 569 is switched ON when the primary calibration system (for the resistive structure 501) is idle and does not produce a calibration current $I_{CAL}$. During this phase of operation, the transistors 5M1 (or M1C and M1B of FIG. 4) are switched OFF, such that a secondary calibration current $I_{REF}$ flows through series resistor 557 (or reference resistor Rs of FIG. 4) undisturbed.

The magnitude of resistor 557 (Rs) is based on the circuit that measures the resistance, such as an ADC that measures the voltage across resistor 557 (not shown). For example, this secondary calibration step may be useful for implementations where the resistor 557 (or any resistor, such as Rs) associated with the calibration current generating circuit is unstable, unknown, subject to process tolerances, or has high temperature coefficients. In the example of FIG. 5, resistor 557 itself may be of the same metal layer as resistive structure 501. Accordingly, resistor 557 may have the same uncertainties—which are calibrated out in the secondary calibration step. However, since resistor 557 only needs to accommodate a small fraction of the maximum load current $I_{LOAD}$, the resistor 557 can be made smaller in area and be higher ohmic than resistive structure 501. The same reasoning may apply to any resistors in the switchable reference current source 507 that generates the secondary calibration current $I_{ref}$.

The reduction in size of the resistor 557 may have additional benefits. For example, if the magnitude of $I_{ref}$ is small enough, more stable and precise resistors (such as Silicon-Chrome thin-film resistors) may be used in the switchable reference current source 572 to stabilize $I_{ref}$. Accordingly, including a secondary calibration capability (through reference block 507) may substantially relax the requirements for the material and construction of resistor 557. Such secondary calibration capability may also be added to any calibration current defining resistors Rs as discussed above, by adding a secondary calibration current source 507 to Rs, and providing a circuit to measure the voltage across reference resistor Rs that is caused by the secondary calibration current. The circuit within secondary calibration current source 507 may be similar to the example seen in block 202 of FIG. 2. It will be understood that any other circuit, means, and method known in the art to generate precision reference currents may also be used based on the concepts discussed herein.

Adding the secondary calibration step as discussed above further reduces the current and power levels used to generate the final precision reference current Iref on which the calibration of Rx of the resistive structure 101 is based in the end. This reduction of current and power levels can be several orders of magnitude per calibration step. This concept can be extended to a ternary (or higher) calibration step(s) until current and power levels are achieved for which a precision reference resistor can be provided at desired cost. The reference resistor also may be synthesized by a known technique that uses switched capacitor or charge balancing circuits that derive a reference current from a reference voltage source, a capacitor, and a time-base.

Figure 6:
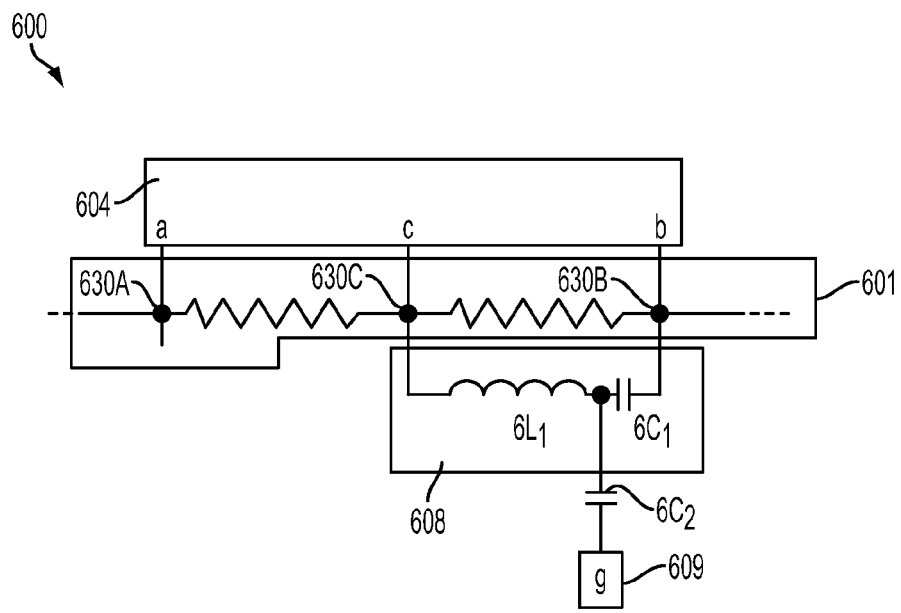
FIG. 6 illustrates part of a system that measures the resistance of a resistive structure, consistent with an embodiment of the present invention.

In some applications (e.g., where the typical broadband sinc spectrum of calibration current pulses is not desired), a resonant tank circuit may be used as a calibration current source. In this regard, FIG. 6 illustrates part of a system 600 that measures the resistance of a resistive structure 602, consistent with an embodiment of the present invention. The example of system 600 includes a resonant tank circuit block 608 comprising an inductor 6L1 in series with a capacitor 6C1. In one embodiment, the tank circuit 608 is excited by inductive or capacitive coupling. For example, the tank circuit 608 is excited by an excitation source 609 via capacitive coupling with capacitor 6C2. In one embodiment, the tank circuit 608 generates a pure sinusoidal calibration current of a predetermined frequency with no harmonics. In one embodiment, the tank circuit 608 is configured to a frequency band where it does not interfere with any sensitive signals in the system.

Figure 7:
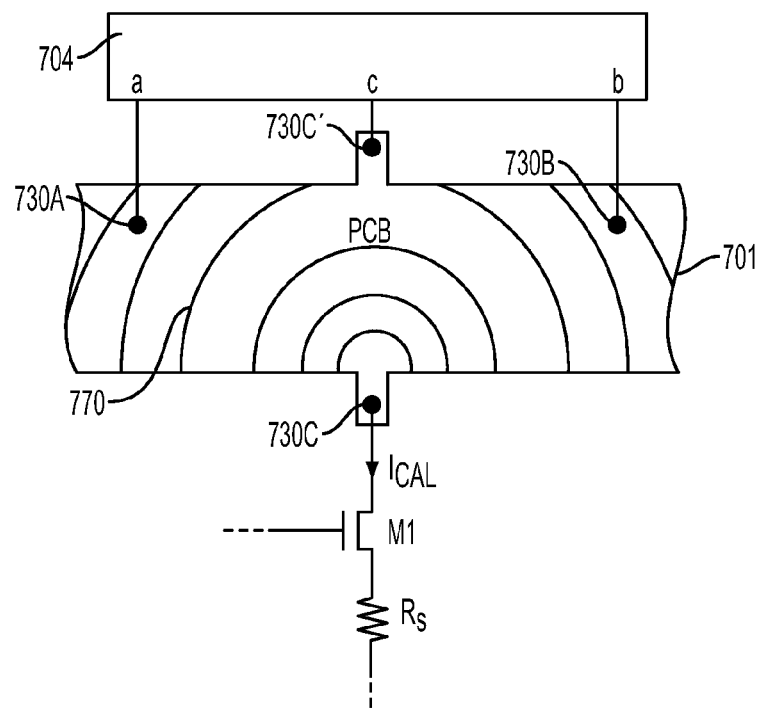
FIG. 7 illustrates an exemplary resistive structure, consistent with an embodiment of the present invention.

FIG. 7 illustrates an exemplary resistive structure 701, consistent with an embodiment of the present invention. For example, the resistive structure may be a distributed resistance provided by a printed circuit board (PCB) foil run 701. FIG. 7 shows an exemplary resistive structure 701 in which the electrical node 1300 from FIG. 1 is essentially split into two nodes 730C and 730C' at (or near) the center of the resistive structure 701. The calibration current $I_{cal}$ is still injected at node 730C, but the signal conditioning circuit block 704 is now connected to node 730C'. This configuration yields a pseudo-Kelvin connection where the influence of the parasitic resistances in the $I_{cal}$ path are mitigated by splitting the third node into two nodes (e.g., 730C and 730C'). FIG. 7 illustrates the approximate equipotential lines 770 caused by $I_{cal}$. It should be noted that when the calibration current $I_{cal}$ is flowing, the voltages at nodes 730C and 730C' are not the same. Thus, the connection may not be a true and ideal Kelvin connection. However, since the bulk of the resistive material between nodes 730C and 730C' still is part of the resistance from node 730A to node 730B, there is a linear relationship (or an additional gain factor to be accounted for) in the resistive structure 701 calibration process, which can be derived for a given geometry. For example, the linear relationship or the gain factor can be determined by direct measurement of a prototype or by finite element analysis software.

Figure 8:
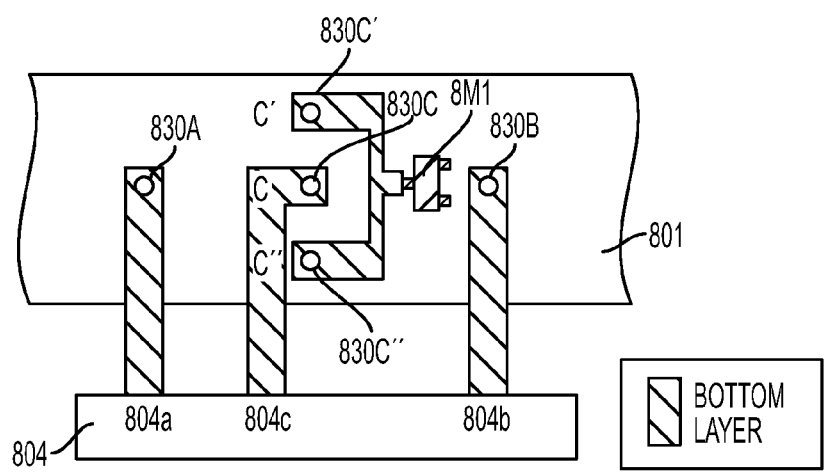
FIG. 8 illustrates an exemplary resistive structure following a pseudo Kelvin connect approach, consistent with an embodiment of the present invention.

FIG. 8 illustrates another variation of the pseudo Kelvin connect approach, consistent with an embodiment of the present invention. For example, there is a two layer PCB board, having a bottom layer (striped) and a top layer (not striped). The drain of the transistor 8M1 is coupled to the bottom layer of the PCB foil runs. Preferably, the bottom layer PCB foil runs are of equal length and as symmetrical as possible, through via holes to physical nodes 830C' and 830C", where both receive part of the calibration current. Similarly, in one embodiment, nodes 830A, 830B, and 830C of the resistive structure 801 (in the top layer) are connected by via holes to the bottom layer traces running to the signal conditioning circuit block 804. In yet another embodiment that is able to handle very large currents, the resistive structure 801 may be a part of a plane within a multilayer PCB and the nodes 830A, 830B, 830C' and 830C" may be vias placed on the plane according to the teachings herein. As was previously discussed, the result of the calibration in this case may be scaled according to finite element analysis results to compensate for the gain factor associated with such distributed resistive structures.

Figure 11:
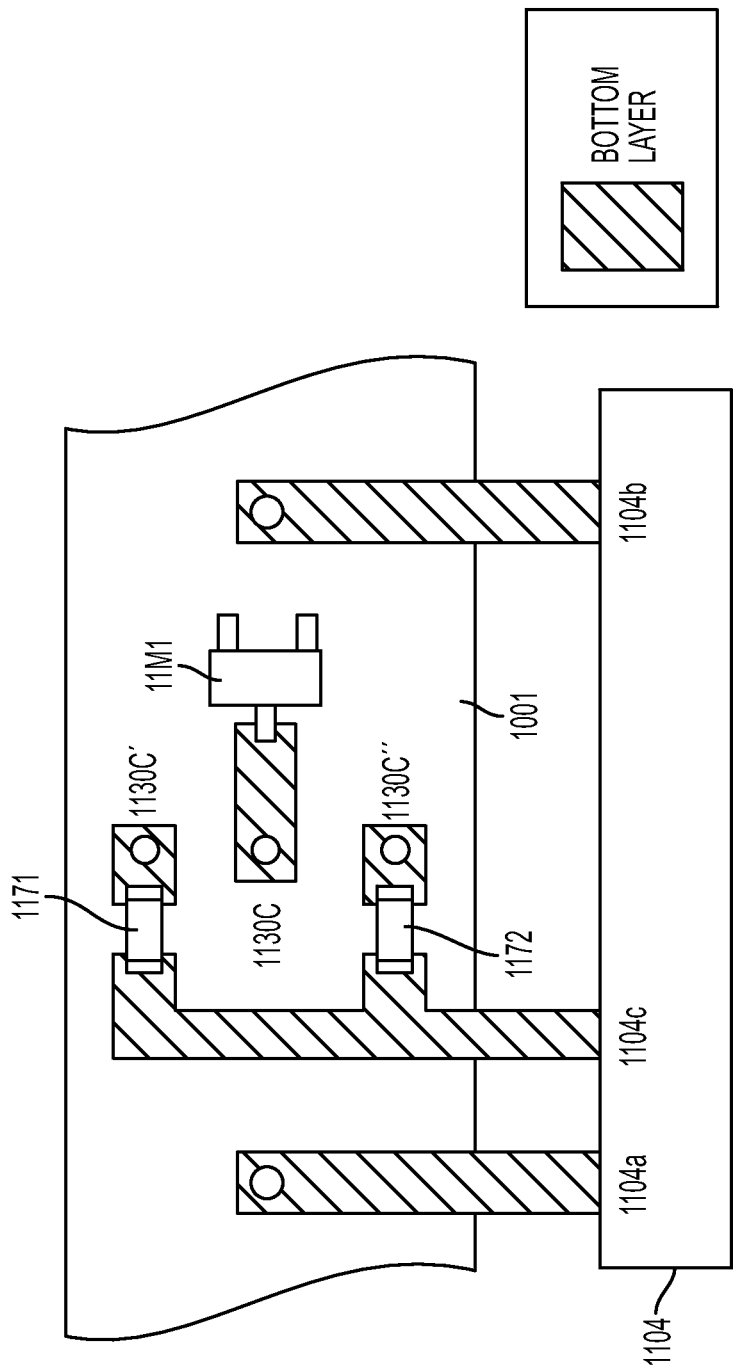
FIG. 11 illustrates an exemplary resistive structure following another pseudo Kelvin connect circuit, consistent with an embodiment of the present invention.
Figure 5:
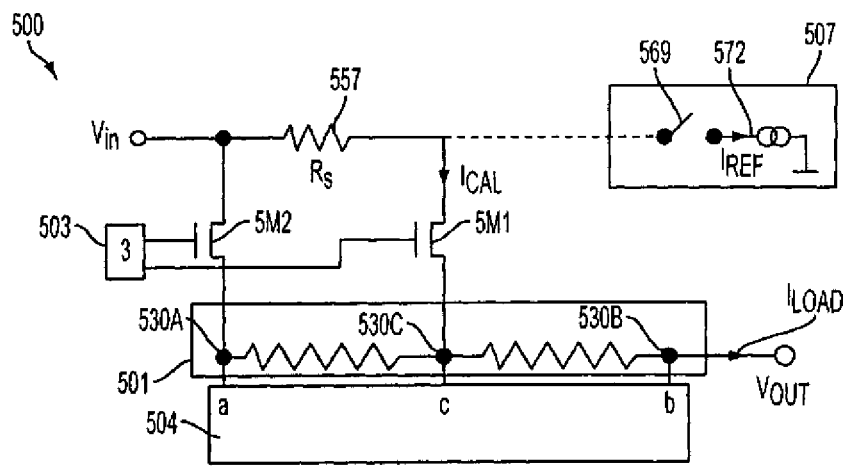

FIG. 11 illustrates an exemplary resistive structure following another pseudo Kelvin connect circuit, consistent with an embodiment of the present invention. For example, the calibration current $I_{cal}$ from regulation transistor 11M1 is injected at a node 1130C of the resistive structure, which may be a printed circuit board trace or plane. The third node response signal is formed by averaging the voltages from adjacent nodes 1130C' and 1130C". In one example, the averaging is performed by two equally sized resistors or capacitors 1171, 1172 coupled to nodes 1130C' and 1130C", respectively. The common node 1104C of the resistors or capacitors used as coupling elements electrically corresponds to the third node (130C) of the idealized equivalent resistive structure comprising lumped elements as provided in the discussion of FIG. 1. It should be noted that other variations of how the calibration current generation circuit and the signal conditioning circuit 1104 may be coupled to a third node of an resistive structure by means of additional electronic components are possible without deviating from the scope and spirit of the embodiments discussed herein.

The components, steps, features, objects, benefits and advantages that have been discussed herein are merely illustrative. None of them, nor the discussions relating to them, are intended to limit the scope of protection in any way. Numerous other embodiments are also contemplated. These include embodiments that have fewer, additional, and/or different components, steps, features, objects, benefits and advantages. These also include embodiments in which the components and/or steps are arranged and/or ordered differently. For example, bipolar transistors (e.g., PNP or NPN) can be used instead of MOS transistors. A PNP may be used instead of NPN, and a PMOS may be used instead of NMOS. Accordingly, it is intended that the invention be limited only in terms of the appended claims.

What is claimed is:

1. A system for measuring electrical resistance, comprising:
    a resistive structure having:
        a first node at a first end of the resistive structure;
        a second node at a second end of the resistive structure; and
        a third node on the resistive structure between the first and second nodes;
    a calibration current generation circuit having an output coupled to the third node of the resistive structure; and
    a signal conditioning circuit comprising:
        a first input coupled to the first node of the resistive structure;
        a second input coupled to the second node of the resistive structure;
        a third input coupled to the third node of the resistive structure; and
        an output,
    wherein the signal conditioning circuit is configured to provide at its output a signal proportional to a difference between a voltage at the third node and a weighted average of the voltages at the first and second nodes of the resistive structure.

2. The system of claim 1, further comprising a signal processing circuit coupled to the output of the signal conditioning circuit, wherein the signal processing circuit is configured to calculate the resistance of the resistive structure.

3. The system of claim 2, wherein the calibration current generation circuit is configured to sequentially couple at least two different calibration currents of different magnitudes or signs into the third node of the resistive structure, and the signal processing circuit is configured to calculate the resistance of the resistive structure from a difference between a first output voltage of the signal conditioning circuit when the calibration current is set to a first value, and a second output voltage of the signal conditioning circuit when the calibration current is set to a second value.

4. The system of claim 3, wherein the calibration current generation circuit comprises a current servo loop having a regulation transistor that is configured to regulate the calibration current to a value determined by a reference voltage and a reference resistor (Rs).

5. The system of claim 4, wherein the regulation transistor of the current servo loop is configured to be switched between at least two current values.

6. The system of claim 5, wherein the regulation transistor of the current servo loop is configured to be switched ON and OFF.

7. The system of claim 4, wherein the signal processing circuit comprises a switched capacitor integrator and a comparator.

8. The system of claim 7, wherein:
    the switched capacitor integrator and comparator are configured as a modulator of a delta sigma analog-to-digital converter; and
    the modulator is configured to use a reference voltage that tracks the reference voltage that is used to regulate the calibration current.

9. The system of claim 1, wherein the signal conditioning circuit comprises:
    an interpolator having a first input coupled to the first node of the resistive structure, a second input coupled to the second node of the resistive structure, and an output; and
    a difference amplifier having a first input coupled to the output of the interpolator and a second input coupled to the third node of the resistive structure, wherein the difference amplifier is configured to amplify a difference between the third node of the resistive structure and a voltage at the output of the interpolator.

10. The system of claim 9, wherein the interpolator is configured to provide a voltage at its output based on:
    a voltage Va at the first node of the resistive structure;
    a voltage Vb at the second node of the resistive structure; and
    an interpolation parameter "a," wherein,
    the voltage at the output is equal or proportional to $0.5*[(1-a)*Va+(1+a)*Vb]$.

11. The system of claim 10, further comprising a circuit for trimming the interpolation parameter "a" such that the voltage at the output of the interpolator is substantially the same magnitude as the voltage at the third node of the resistive structure when the calibration current is zero.

12. The system of claim 10, further comprising a circuit configured to tune the interpolation parameter "a" such that influence of load current flowing though the resistive structure on the signal at the output of the signal conditioning circuit is minimized.

13. The system of claim 10, further comprising a correlator circuit having a first correlator input coupled to the output of the signal conditioning circuit.

14. The system of claim 13, wherein the correlator circuit comprises a multiplier coupled to an integrator.

15. The system of claim 13, wherein:
the output of the signal conditioning circuit is a differential output having positive and negative polarity output nodes; and
the correlator circuit comprises a polarity interchanging switch arrangement coupled to an integrator.

16. The system of claim 13, wherein the correlator circuit further includes a second input, wherein the second input is:
differential; and
coupled to the first and second nodes of the resistive structure.

17. The system of claim 13, further comprising at least one tuning current source coupled to at least the first or second node of the resistive structure, wherein the at least one tuning current source is configured to provide tuning current pulses for tuning the interpolator.

18. The system of claim 17, wherein the calibration current generation circuit comprises a servo loop having:
a regulation transistor configured to regulate the calibration current to a value determined by a reference voltage and a reference resistor;
a first current steering transistor coupled between the regulation transistor and the third node of the resistive structure; and
a second current steering transistor coupled between the regulation transistor and one of (i) the first node or (ii) the second node of the resistive structure.

19. The system of claim 17, further comprising a plurality of switches having a common node coupled to a reference voltage and configured to render active one of (i) the first regulation transistor or (ii) the second regulation transistor, wherein:
the calibration current generation circuit comprises a servo loop having at least two regulation transistors configured to regulate the calibration or tuning current to a value determined by a reference voltage and a reference resistor (Rs);
the first regulation transistor is coupled to the third node of the resistive structure; and
the second regulation transistor is coupled to one of the (i) first or (ii) second node of the resistive structure.

20. The system of claim 9, further comprising:
an input voltage node (Vin);
a reference resistor;
at least two current steering transistors, wherein a first current steering transistor has a source coupled to the third node of the resistive structure and a second current steering transistor has a source coupled to the first node of the resistive structure;
a control circuit having a separate output coupled to a gate of the at least two current steering transistors, respectively;
wherein:
the first node of the reference resistor is coupled to the input voltage node;
the second node of the reference resistor is coupled to the third node of the resistive structure via the first current steering transistor;
the input node is coupled to the first node of the resistive structure via the second current steering transistor; and
the control circuit is configured to independently switch the current steering transistors ON and OFF.

21. The system of claim 20, further comprising a secondary calibration current source coupled to the reference resistor.

22. The system of claim 9, wherein the calibration current generation circuit comprises a resonant tank circuit that is coupled between the third node of the resistive structure and to either the first or second node of the resistive structure.

23. A method of measuring resistance of a resistive structure having a first node at a first end of the resistive structure, a second node at a second end of the resistive structure, and a third node between the first node and the second node of the resistive structure and adapted to receive a calibration current; a signal conditioning circuit comprising a first input coupled to the first node of the resistive structure, a second input coupled to the second node of the resistive structure, a third input coupled to the third node of the resistive structure; and an output, the method comprising:
determining a first calibration signal by measuring a voltage at the output when no calibration current is injected into the third node of the resistive structure;
injecting a calibration current into the third node of the resistive structure;
determining a second calibration signal by:
interpolating voltages at the first and second nodes of the resistive structure; and
subtracting the interpolated voltage from a voltage at the third node of the resistive structure; and
determining an absolute value of a difference between the determined first calibration signal and the determined second calibration signal, wherein the absolute value is proportional to a product of the resistance of the resistive structure and the calibration current.

24. The method of claim 23, wherein the calibration current is injected into the third node of the resistive structure in a form of a pulse.

25. The method of claim 23, further comprising performing the first calibration signal and the second calibration signal periodically.

26. The method of claim 23, further comprising measuring a current flowing between the first node and the second node of the resistive structure.

27. The method of claim 23, wherein interpolating the voltage at the first node of the resistive structure and the voltage at the second node of the resistive structure includes determining a weighted average voltage (Vavg) between the voltages at the first node of the resistive structure and at the second node of the resistive structure based on:
a voltage Va at the first node of the resistive structure;
a voltage Vb at the second node of the resistive structure; and
an interpolation parameter "a," wherein, $$Vavg = 0.5*[(1-a)*Va + (1+a)*Vb].$$

28. The method of claim 27, further comprising:
amplifying a difference between the weighted average voltage (Vavg) and a voltage at the third node of the resistive structure by an amplifier gain factor GA; and
providing the amplified difference as an output voltage at the output (Vout).

29. The method of claim 28, wherein the output voltage at the output (Vout) is based on:
a voltage Vc at the third node of the resistive structure, wherein, $$Vout = GA*\{0.5*[(1-a)*Va + (1+a)*Vb] - Vc\}.$$

30. The method of claim 27, further comprising tuning the signal conditioning circuit to compensate for a difference between a resistance between the first and third nodes of the resistive structure and a resistance between the second and third nodes of the resistive structure.

31. The method of claim 30, wherein the tuning comprises varying the interpolation parameter "a" until the voltage at the output is minimized when no calibration current is injected into the third node of the resistive structure.

32. The method of claim 31, wherein the tuning further comprises using a load current ripple as a signal source, wherein the load current ripple is caused by at least one of:
(i) a switch-mode power supply coupled to the first or third node of the resistive structure; or
(ii) a load coupled to the first or third node of the resistive structure.

33. The method of claim 31, wherein the tuning further comprises providing a current pulse to at least one of (i) the first node of the resistive structure or (ii) the second node of the resistive structure to create an artificial ripple current in the resistive structure to tune the signal conditioning circuit.

34. The method of claim 32, wherein the switch mode power supply is modulated during the tuning process to generate a load current ripple.

* * * * *

UNITED STATES PATENT AND TRADEMARK OFFICE
CERTIFICATE OF CORRECTION

PATENT NO. : 8,947,101 B2  
APPLICATION NO. : 13/734581  
DATED : February 3, 2015  
INVENTOR(S) : Bernhard Helmut Engl Page 1 of 2

It is certified that error appears in the above-identified patent and that said Letters Patent is hereby corrected as shown below:

In the Drawings

Please replace Figure 5 with the accompanying Replacement Sheet. In Figure 5 designator 330A has been amended to read 530A; designator 330B has been amended to read 530B, and designator 330C has been amended to read 530C.

In the Specification

Column 5, line 51 now reads -- node 1300 -- should read "node 130C".

Column 8, line 30 now reads -- interpolator 222 -- should read "interpolator 220".

Column 8, line 31 now reads -- amplifier 240 -- should read "amplifier 222".

Column 14, line 18 now reads -- resistive structure 602 -- should read "resistive structure 601".

Column 14, line 36 now reads -- node 1300 -- should read "node 130C".

Signed and Sealed this
Fourteenth Day of July, 2015

Michelle K. Lee
*Director of the United States Patent and Trademark Office*